United States Patent
Kotani et al.

(10) Patent No.: US 6,853,743 B2
(45) Date of Patent: Feb. 8, 2005

(54) MASK PATTERN CORRECTION METHOD, MASK PATTERN CREATION SYSTEM USING THE CORRECTION METHOD, AND COMPUTER-READABLE RECORDING MEDIUM

(75) Inventors: Toshiya Kotani, Sagamihara (JP); Satoshi Tanaka, Kawasaki (JP); Soichi Inoue, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 713 days.

(21) Appl. No.: 09/748,227

(22) Filed: Dec. 27, 2000

(65) Prior Publication Data
US 2001/0005566 A1 Jun. 28, 2001

(30) Foreign Application Priority Data
Dec. 28, 1999 (JP) .......................................... 11-375477

(51) Int. Cl.[7] .............................. G06K 9/00; G03F 9/00; G06F 17/50
(52) U.S. Cl. ............................ 382/144; 382/199; 430/5; 716/19
(58) Field of Search ................................ 382/141, 144, 382/145, 181, 199, 205, 266, 268, 269; 430/5, 30, 302; 716/19

(56) References Cited

U.S. PATENT DOCUMENTS 5,475,766 A * 12/1995 Tsuchiya et al. ............ 382/144
5,825,647 A * 10/1998 Tsudaka ....................... 700/57
5,862,058 A    1/1999 Samuels et al.
5,879,844 A *  3/1999 Yamamoto et al. ........... 430/30
6,245,466 B1 * 6/2001 Kotani et al. .................. 430/5
6,350,977 B2 * 2/2002 Taoka .......................... 250/204

FOREIGN PATENT DOCUMENTS

JP          11-102062         4/1999

OTHER PUBLICATIONS

*SPIE*, "Correcting for Proximity Effect Widens Process Latitude", by R.C. Henderson et al., vol. 2197, pp 361–370, 1994.

* cited by examiner

*Primary Examiner*—Kanjibhai Patel
(74) *Attorney, Agent, or Firm*—Finnegan, Henderson, Farabow, Garrett & Dunner, L.L.P.

(57) ABSTRACT

A mask pattern correction method includes the step of extracting a correction target edge from a design pattern, the step of calculating the distance from the correction target edge to the nearest edge of an adjacent pattern, the step of calculating the correction value by a simulation in accordance with a pattern layout present within a given range determined by the correction target edge, and moving the correction target edge on the basis of the calculated correction value when the distance calculated in the distance calculation step is smaller than a predetermined distance, and the step of moving the correction target edge on the basis of an correction value set as a rule in advance in accordance with the distance when the distance calculated in the distance calculation step is larger than the predetermined distance.

1 Claim, 7 Drawing Sheets

MASK PATTERN CORRECTION METHOD, MASK PATTERN CREATION SYSTEM USING THE CORRECTION METHOD, AND COMPUTER-READABLE RECORDING MEDIUM

CROSS-REFERENCE TO RELATED APPLICATIONS

This application is based upon and claims the benefit of priority from the prior Japanese Patent Application No. 11-375477, filed Dec. 28, 1999, the entire contents of which are incorporated herein by reference.

BACKGROUND OF THE INVENTION

The present invention relates to a mask pattern correction method for forming a desired pattern on a wafer, a mask pattern creation system using the correction method, and a computer-readable recording medium.

The advance of recent semiconductor manufacturing techniques is remarkable, and semiconductors 0.20 µm in minimum processing size can be manufactured. This miniaturization is realized by rapid progress of a micro-pattern formation technique called photolithography. Photolithography includes a series of steps of creating a mask from an LSI design pattern, irradiating the mask with light, exposing a resist applied to a wafer to light in accordance with a pattern drawn on the mask by a projection optical system, developing the resist in accordance with the photosensitive distribution, and forming a resist pattern on the wafer. The resist pattern formed by these steps is used as a mask to etch an underlayer, thereby forming an LSI pattern on the wafer.

When the pattern size was much larger than the limit resolution of the projection optical system, it was possible to directly draw as a design pattern the planar shape of an LSI pattern to be formed on a wafer, create a mask pattern faithful to the design pattern, transfer the mask pattern onto a wafer by the projection optical system, etch an underlayer, and form a pattern almost conforming to the design pattern. However, as patterns continue to shrink in feature size, the optical proximity effect becomes prominent. With a mask created in conformity with a design pattern, a pattern formed on a wafer is different from the design pattern. Adverse effects along with this are becoming serious.

For example, on a line & space (L/S) pattern, exposed dose amounts for finishing a isolated pattern and dense pattern present on the same mask plane with desired sizes are different depending on the respective patterns, so an common dose margin between isolated and dense pattern margin necessary in the lithography step cannot be obtained. To solve this, a method of moving the pattern edge position in advance so as to finish a planar shape obtained upon exposure with a predetermined exposure amount, within a predetermined size regardless of the pattern density is proposed. This is called correction of the optical proximity effect. This correction methods are roughly classified into two schemes.

According to one scheme, the edge moving amount is set as a rule in advance, and the edge position of design data is moved in accordance with the rule (ruse-based scheme). This method sets the edge moving amount as a rule in accordance with the distance between an edge to be corrected and its nearest edge. The edge moving amount can therefore be described by a simple rule, and the correction time is relatively short.

To realize high-precision correction of the optical proximity effect, the edge moving amount must be changed in accordance with not only the distance to the nearest edge but also the line widths of a pattern to be corrected and its nearest pattern, and the like. Of such methods, a method of changing the edge moving amount in accordance with the line width of a pattern to be corrected is reported in Proc. SPIE 2197 (1994) 361 or the like. This method is proved to be effective for increasing the correction precision.

However, to change the edge moving amount in accordance with the line width of the nearest pattern, a more complicated correction rule is required. A test pattern shape and measurement technique necessary for rule setting become very cumbersome accordingly.

For this reason, a simulation-based correction method as the other scheme is effective. According to this method, a range necessary for obtaining the optimal edge moving amount is determined from design data having various pattern layouts, and the optimal edge moving amount can be calculated within the range by a light intensity simulation technique. Hence, the simulation-based scheme need not set any complicated rule as described above, and can perform high-precision correction by only determining parameter values used for a model for predicting experimental results at higher precision.

The simulation-based scheme is very effective for increasing the correction precision. However, this scheme executes calculation for calculating the correction amount in accordance with each pattern layout, so the correction time is often very long.

BRIEF SUMMARY OF THE INVENTION

As described above, correction of the optical proximity effect by the conventional rule-based scheme requires only a short correction time, but is difficult to obtain a high correction precision. To the contrary, correction of the optical proximity effect by the simulation-based scheme can achieve high-precision correction, but takes a very long correction time.

The present invention has been made to overcome the conventional drawbacks, and has as its object to provide a mask pattern correction method for realizing high-precision correction within a short correction time, a mask pattern creation system using the correction method, and a computer-readable recording medium.

The present invention has the following arrangement in order to achieve the above object.

(a) The present invention provides a mask pattern correction method used to form a desired pattern on a wafer by a projection optical system, comprising the step of extracting a correction target edge from a mask design pattern, the step of calculating the distance from the correction target edge to a nearest edge of an adjacent pattern, the step of calculating the correction value according to pattern layout within a given range originated from the correction target edge by a simulation when the distance calculated in previous step is smaller than a given critical value, the step of moving the correction target edge on the basis of the correction value calculated by the simulation, and the step of moving the correction target edge on the basis of an correction value set as a rule in advance when the distance calculated in previous step is not smaller than the critical value.

Preferred aspects of the present invention are as follows.

The simulation uses a light intensity simulation technique.

The correction value set as a rule represents as a parameter at least one of a size of a pattern including the correction target edge, a distance between the correction target edge and a pattern edge adjacent to the correction target edge, and a size of the pattern adjacent to the correction target edge.

(b) The present invention provides a mask pattern correction method used to form a desired pattern on a wafer by a projection optical system, comprising the step of extracting a correction target edge from a design pattern, the step of calculating a length of the extracted correction target edge, the first step of calculating correction value determined one-dimensionally by pattern layout perpendicular to the correction target edge when the length of the correction target edge calculated in the previous step is not smaller than a predetermined critical length, and the second step of calculating correction value determined two-dimensionally by pattern layout around the correction target edge when the length of the correction target edge calculated in the previous step is smaller than a predetermined critical length, the first step including the distance calculation step of calculating a distance S from target edge to a nearest edge of a adjacent pattern perpendicularly, the step of calculating the correction value by one-dimensional simulation according to pattern layout perpendicular to the correction target edge, and moving the correction target edge on the basis of the calculated correction value when the calculated distance S is smaller than a predetermined critical value S', and the step of moving the correction target edge on the basis of an correction value set as a rule in advance using as a parameter at least one of the distance S, a line width W of the pattern including the correction target edge, and a line width W' of a pattern including an edge adjacent to the correction target edge when the calculated distance S is not smaller than the critical value S', and the second step including the distance calculation step of calculating a distance sp from the correction target edge to a nearest edge in the perpendicular direction, and calculating a distance sh to a nearest edge in the direction of length, the step of calculating the correction value by two-dimensional simulation according to pattern layout around the correction target edge and moving the correction target edge on the basis of the calculated correction value when at least either one of the distances sp and sh calculated in the distance calculation step is smaller than a corresponding one of predetermined distances sp' and sh', and the step of moving the correction target edge on the basis of an edge moving amount set as a rule in advance using as a parameter at least one of the distances sp and sh, the line width W of the pattern containing the correction target edge, and line widths wp and wh of patterns adjacent to the correction target edge when the calculated distance sp is not smaller than the critical distance sp', and the calculated distance sh is not smaller than the critical distance sh'.

(c) The present invention provides a mask pattern creation system including a mask design pattern correction method used to form a desired pattern on a wafer by a projection optical system, comprising a correction target edge extraction unit for extracting a pattern having a correction target edge from a design pattern, a space width calculation unit for calculating a distance from the correction target edge to a nearest edge of an adjacent pattern, a simulation calculation unit for calculating the correction value according to pattern layout within a given range originated from the correction target edge by a simulation when a space width calculated by the space width calculation unit is smaller than a predetermined critical value, a rule-based moving amount calculating unit for moving the correction target edge on the basis of an correction value set as a rule in advance when the distance calculated by the space width calculation unit is not smaller than the critical value, and a correction unit for correcting the design pattern on the basis of the moving amount of the correction target edge calculated by the simulation moving amount calculation unit or the rule-based moving amount calculation unit.

Preferred aspects of the present invention are as follows.

The simulation uses a light intensity simulation technique.

The correction value set as a rule represents as a parameter at least one of a size of a pattern containing the correction target edge, a distance between the correction target edge and a pattern adjacent to the correction target edge, and a size of the pattern adjacent to the correction target edge.

(d) The present invention provides a computer-readable recording medium which records a program for causing a computer to realize a mask pattern correction method used to form a desired pattern on a wafer by a projection optical system, wherein the program causes the computer to realize a function of extracting a correction target edge from a design pattern, a distance calculation function of calculating a distance from the correction target edge to a nearest edge of an adjacent pattern, a moving amount calculation function of calculating an correction value by a simulation when the distance calculated by the distance calculation function is smaller than a predetermined distance, a function of moving the correction target edge on the basis of the correction value calculated by the moving amount calculation function, and a function of moving the correction target edge on the basis of an correction value set as a rule in advance when the distance calculated by the distance calculation function is not smaller than the predetermined distance.

The present invention has the following operation effects with the above arrangement.

If the present invention is adopted to distribute the correction scheme to the simulation- and rule-based schemes in accordance with the distance between a correction target edge and an adjacent pattern, high-speed correction can be performed without decreasing the correction precision. Since a correction rule created in advance is relatively simple, no cumbersome test pattern or measurement technique is required.

Particularly in a logic product whose adjacent space width S is designed to be relatively wide, the present invention is very effective, and can realize high-speed, high-precision correction. Correction of the two-dimensional optical proximity effect is becoming inevitable. This is, however, difficult to realize only by the simulation-based scheme in terms of the current computer performance. It is very important to obtain a higher-precision correction amount at a higher speed using the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described below with reference to the several views of the accompanying drawing.

[First Embodiment]

Figure 1:
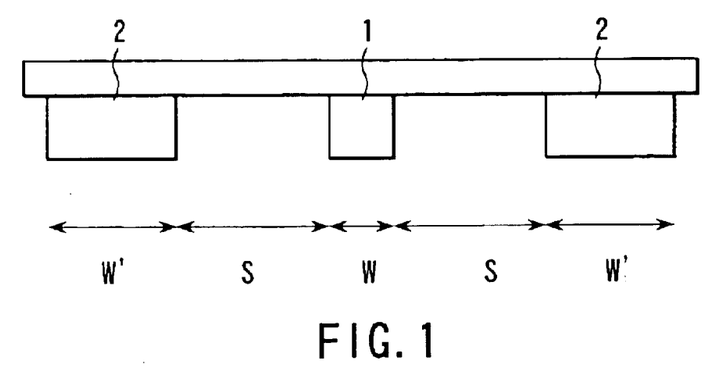
FIG. 1 is a plan view showing the layout of a correction target pattern and a pattern adjacent to the pattern according to the first embodiment.

A one-dimensional pattern shown in FIG. 1 was used to calculate the finished size of a pattern when a line width W of a correction target pattern 1, a space width S to the edge of an adjacent pattern 2, and a line width W' of the adjacent pattern, which are main factors influencing the finished size of the correction target pattern 1, were changed. Exposure conditions were λ=0.248 μm, NA=0.68, σ=0.75, ε=0.67, and a 6%-HT bright-field mask. Masks having W=0.14 to 0.25 μm, S=W to 2.0 μm, and W'=W to 2.0 μm were formed. The light intensity was calculated for each mask. To consider the influence of the resist developing process, the Gaussian function was convoluted in each calculated optical image. The finished size was calculated from the resultant image.

Figure 2A:
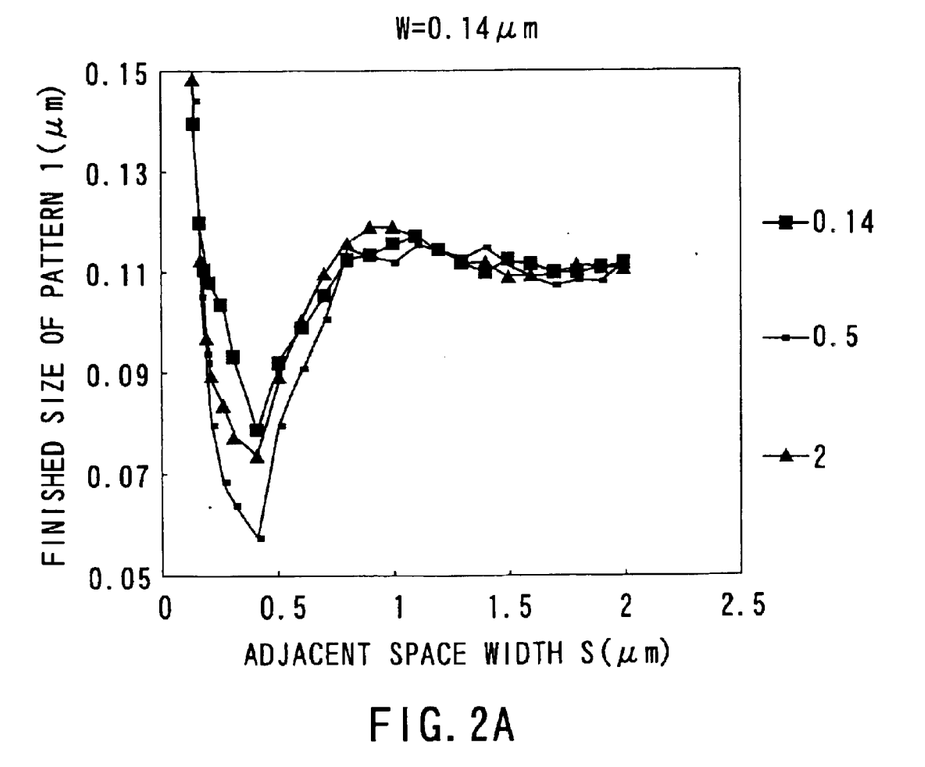
FIG. 2A is a graph showing the finished size of the correction target pattern as a function of an adjacent space width S for a line width W of the correction target pattern= 0.14 μm and a line width W' of the adjacent pattern=0.14, 0.5, or 2 μm.
Figure 2B:
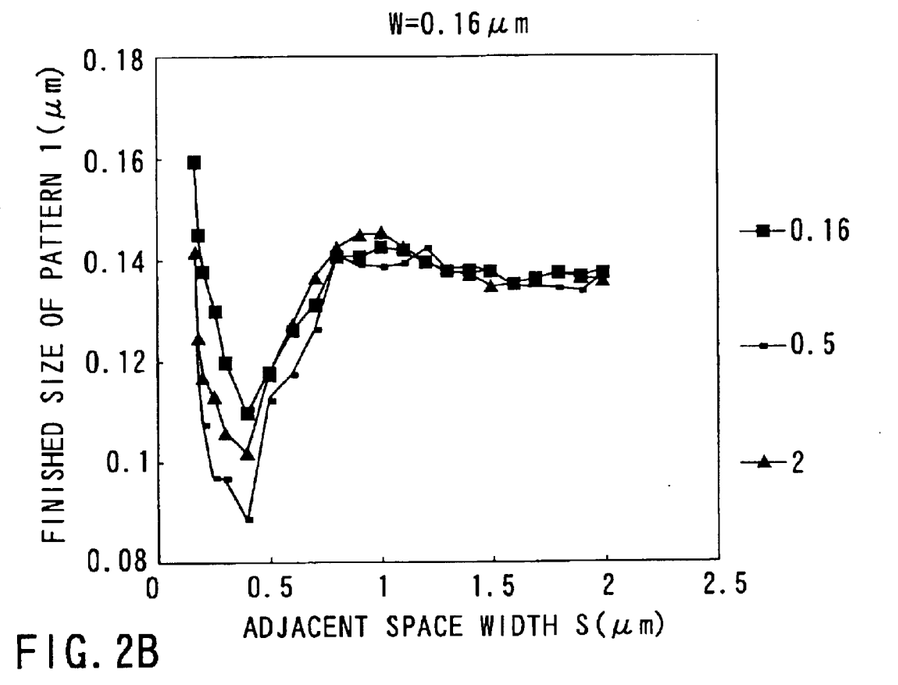
FIG. 2B is a graph showing the finished size of the correction target pattern as a function of the adjacent space width S for the line width W of the correction target pattern=0.16 μm and the line width W' of the adjacent pattern=0.16, 0.5, or 2 μm.
Figure 2C:
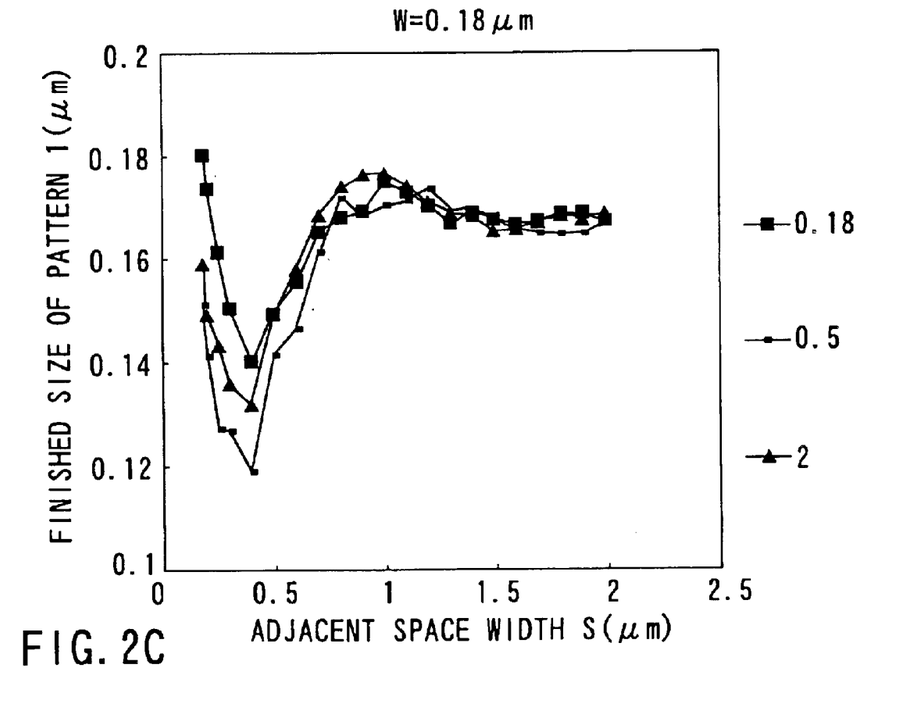
FIG. 2C is a graph showing the finished size of the correction target pattern as a function of the adjacent space width S for the line width W of the correction target pattern=0.18 μm and the line width W' of the adjacent pattern=0.18, 0.5, or 2 μm.

FIGS. 2A to 2C show the finished size of a pattern when S and W are changed for each line width W of the correction target pattern. As is apparent from FIGS. 2A to 2C, the finish pattern size changes depending on not only the adjacent space width S but also the line width W' of the pattern 2 adjacent to the correction target pattern 1. In other words, no satisfactory correction precision can be obtained by a correction method of determining the moving amount of a correction target edge only by the adjacent space width S.

Figure 3A:
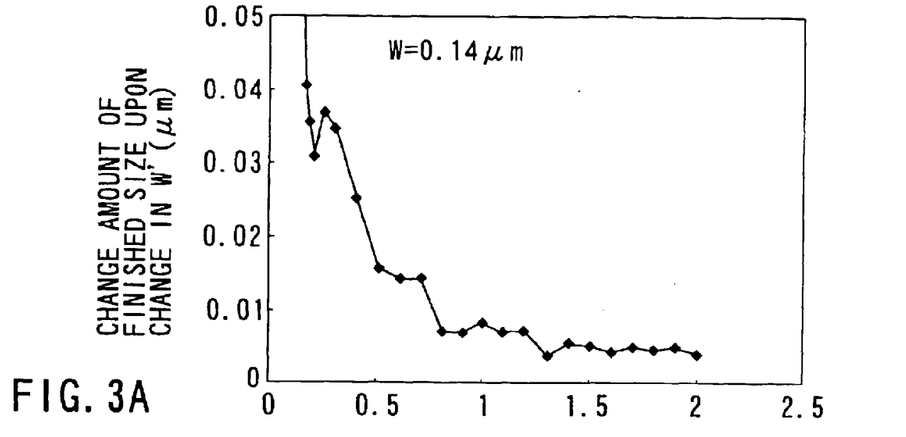
FIG. 3A is a graph showing the change amount of the finished size of the correction target pattern as a function of the adjacent space width S for the line width W of the correction target pattern=0.14 μm.
Figure 3B:
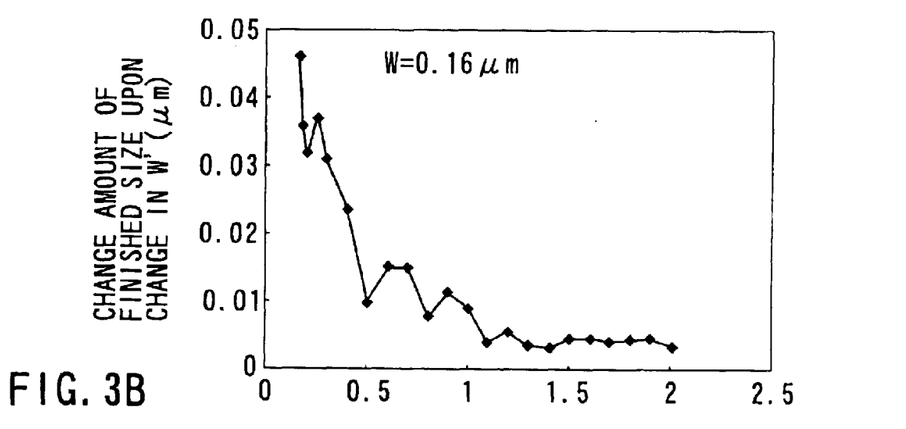
FIG. 3B is a graph showing the change amount of the finished size of the correction target pattern as a function of the adjacent space width S for the line width W of the correction target pattern=0.16 μm.
Figure 3C:
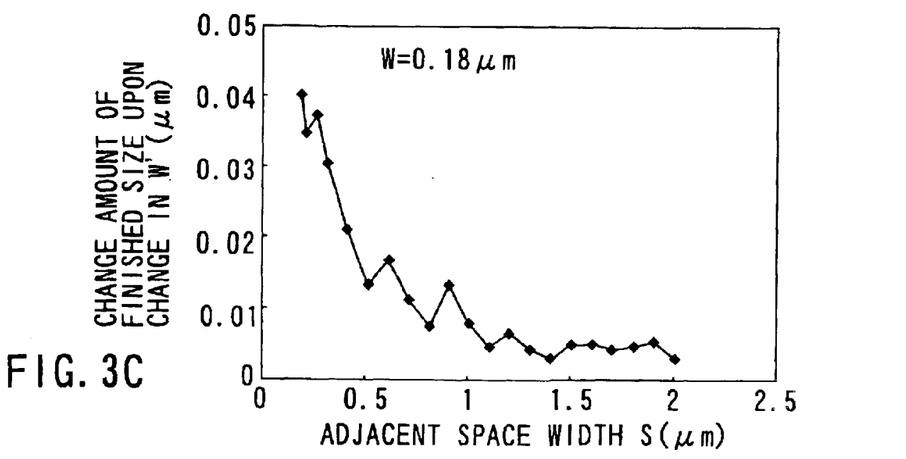
FIG. 3C is a graph showing the change amount of the finished size of the correction target pattern as a function of the adjacent space width S for the line width W of the correction target pattern=0.18 μm.

FIGS. 3A to 3C show the change amount of the finished size as a function of the adjacent space width S when W' changes. As is apparent from FIGS. 3A to 3C, the finished size changes depending on W much more as the adjacent space width S is smaller under the above conditions, and the size change amount is as large as about 40 to 60 nm.

That is, high-precision correction was found to be difficult to perform unless a correction rule considering not only the adjacent space width S but also the adjacent pattern line width W' was set in performing correction by the rule-based scheme.

[Second Embodiment]

A critical value S' of the adjacent space width S assigned to the simulation- or rule-based scheme was calculated on the basis of the results of the first embodiment.

Assuming that the minimum moving amount of a correction target edge that is determined by execution/non-execution of mask inspection, the allowance of the mask data amount, and the like is 5 nm, and MEF (Mask Enhanced Factor) is 1 to 2, the finished size suffers a size error of about 5 nm×2 (number of edges)×MEF=about 10 to 20 nm. At this time, the size error amount cannot be decreased unless the minimum edge moving amount is decreased. Note that MEF is the change amount (nm) of the finished size on a wafer when the mask changes by 1 nm.

As is apparent from FIGS. 3A to 3C, the change amount of the finished size depending on the adjacent pattern line width W' is about 10 nm for an adjacent space width S of 0.8 μm or more. Also when masks were a Cr mask and dark-field mask, the same calculation as in the first embodiment was executed. In any case, the change amount of the finished size depending on the pattern line width W was found to be about 10 nm in a range wherein the adjacent space width was 0.8 μm or more.

Even if the adjacent space width is 0.8 μm or more, and the change amount of the finished size depending on the adjacent pattern line width W' is about 10 nm, this size change amount cannot be corrected as far as the minimum edge moving amount is 5 nm.

More specifically, when the minimum edge moving amount is 5 nm, a pattern having an adjacent space width S of 0.8 μm or more is corrected by correction of the optical proximity effect by the rule-based scheme using as a rule an edge moving amount set in accordance with the adjacent space width S. This can realize correction at sufficiently high precision.

When the minimum edge moving amount is 2.5 nm, the size error amount is about 5 to 10 nm as a result of the same calculation. As shown in FIGS. 3A to 3C, a pattern is corrected by the rule-based scheme when the adjacent space width S is 1.0 μm or more, and by the simulation-based scheme when the adjacent space width S is smaller than 1.0 μm. This can realize high-precision correction.

High-speed, high-precision correction was found to be possible by changing the width S assigned to the rule- or simulation-based scheme in accordance with the minimum edge moving amount, as described above.

[Third Embodiment]

Figure 4:
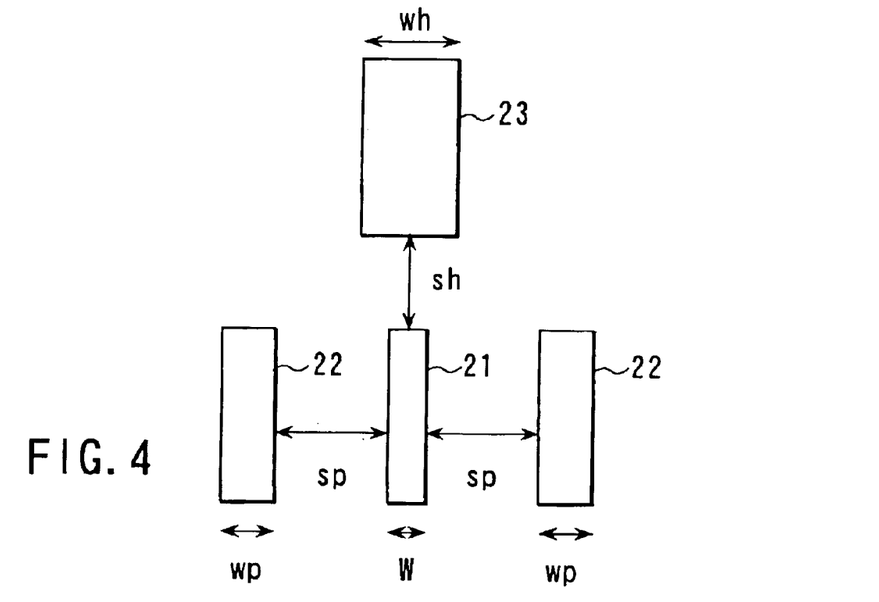
FIG. 4 is a plan view showing the layout of a correction target pattern and a pattern adjacent to the pattern.

Correction of a two-dimensional pattern shown in FIG. 4 will be explained. A correction target pattern 21 is corrected in consideration of a pattern 22 nearest in a direction perpendicular to the direction of length of the correction target pattern 21, and a pattern 23 nearest in the direction of length of the correction target pattern 21.

The third embodiment calculated shortening amounts when adjacent pattern space widths sp and sh between the correction target pattern 21 and the patterns 22 and 23 adjacent to this correction target pattern, and line widths wp and wh of the adjacent patterns 22 and 23 changed, and checked the change amounts of the shortening amounts particularly when the line widths wp and wh of the patterns 22 and 23 changed. In this case, the shortening amount is defined as a retreat amount from the end of a finished pattern calculated from the correction target pattern 21, and a positive shortening amount means retreat.

When the shortening amount changes depending on the line widths wp and wh of the adjacent patterns 22 and 23, no desired correction precision can be obtained even by setting the shortening amount as a rule only by the space widths sp and sh between the correction target pattern 21 and the adjacent patterns 22 and 23. In other words, even if the size of an auxiliary pattern added to the distal end of a line is set as a rule only by the adjacent space widths sp and sh in order to reduce the shortening amount, a high-precision correction result is difficult to attain.

On the other hand, when the shortening amount hardly depends on the adjacent pattern line widths wp and wh, it is effective to set as a rule the size of an auxiliary pattern by only the adjacent space widths sp and sh and perform high-speed correction.

For this reason, critical values sp' and sh' of the adjacent space widths sp and sh at which the shortening amount hardly depends on the adjacent pattern line widths wp and wh were obtained.

Figure 5:
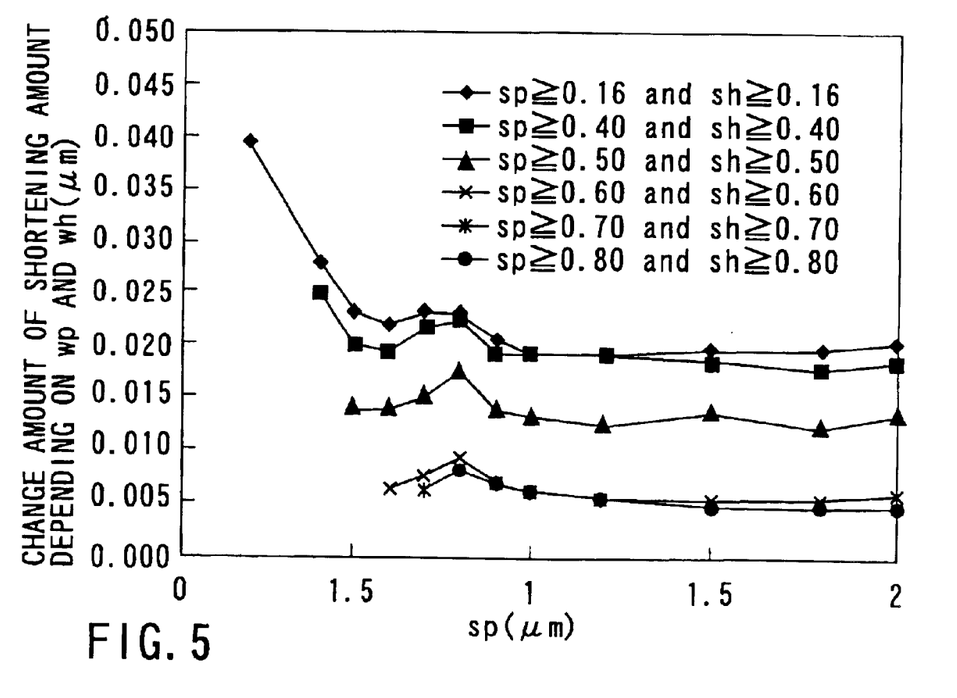
FIG. 5 is a graph showing the change amount of the shortening amount when adjacent pattern line widths wp and wh change.

FIG. 5 shows the change amount of the shortening amount when the adjacent pattern line widths wp and wh change. This represents the results of a case wherein exposure conditions were $\lambda=0.248$ μm, NA=0.68, σ=0.75, ε=0.67, and 6%-HT bright-field mask, and masks having the fixed line width W=0.16 μm, the adjacent space widths sh and sp=0.16 to 2.0 μm, and wp and wh=0.16 μm and 2.0 μm were used.

From these results, when the adjacent space widths sh and sp are small, the shortening amount changes depending on the adjacent pattern line widths wp and wh. When the adjacent space widths sp and sh are 0.6 μm or more, the shortening amount decreases to about 10 nm, and hardly depends on the adjacent pattern line widths wp and wh. Therefore, when the adjacent space widths sp and sh are smaller than 0.6 μm, the shortening amount is corrected by the high-precision simulation-based scheme, and when the adjacent space widths sp and sh are 0.6 μm or more, the shortening amount is corrected by the high-speed rule-based scheme. High-speed correction can be achieved without decreasing the correction precision.

[Fourth Embodiment]

The above-described embodiments execute correction in consideration of the length and line width of a pattern to be corrected. Depending on the length of the edge of a pattern, it is possible to ignore the line width of the pattern, process the pattern as a one-dimensional one, and more easily correct the pattern. The fourth embodiment will describe a correction method considering this, and a mask pattern correction system using this correction method.

Figure 6A:
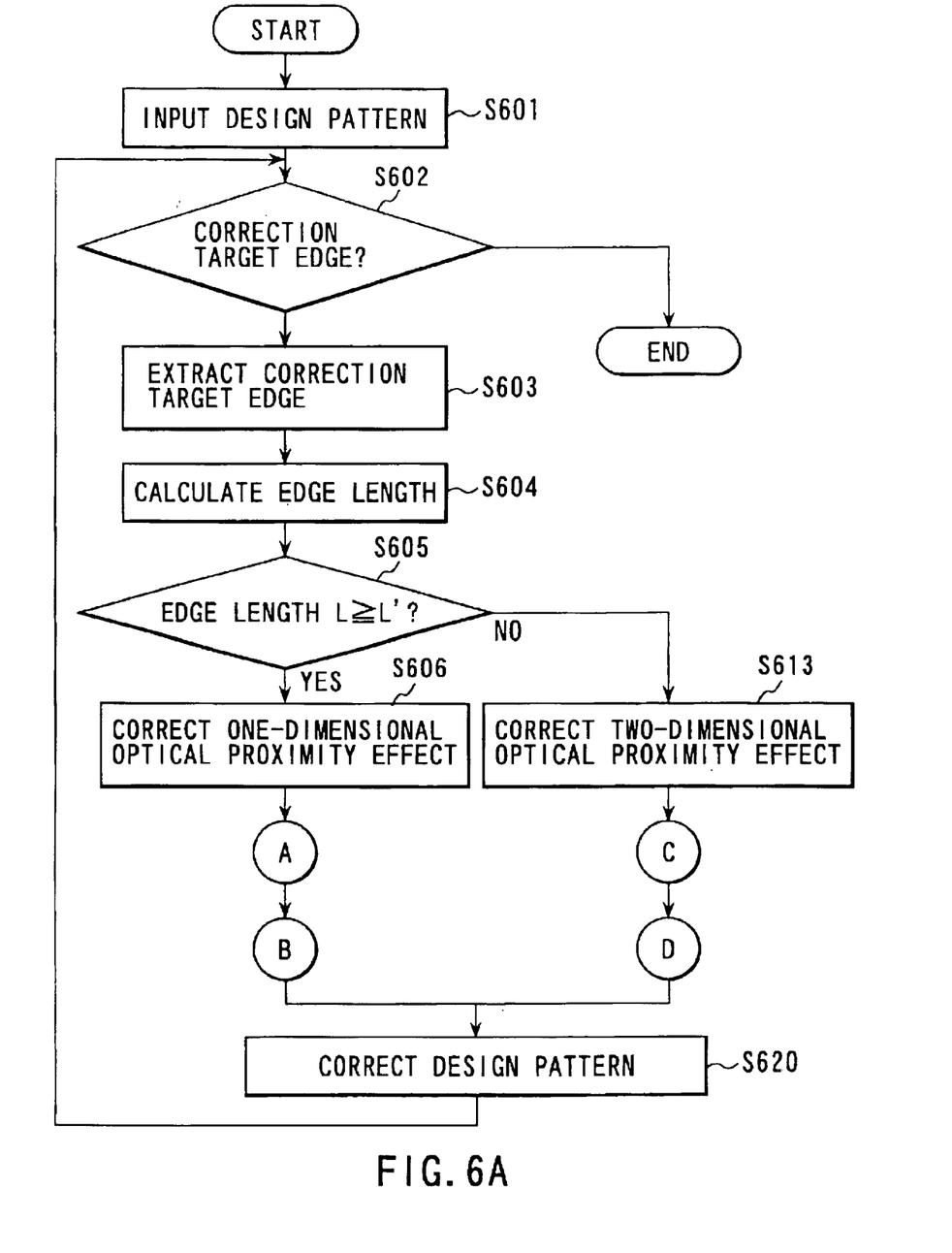
FIGS. 6A to 6C are flow charts showing the outline of a pattern edge correction method according to the fourth embodiment.
Figure 6B:
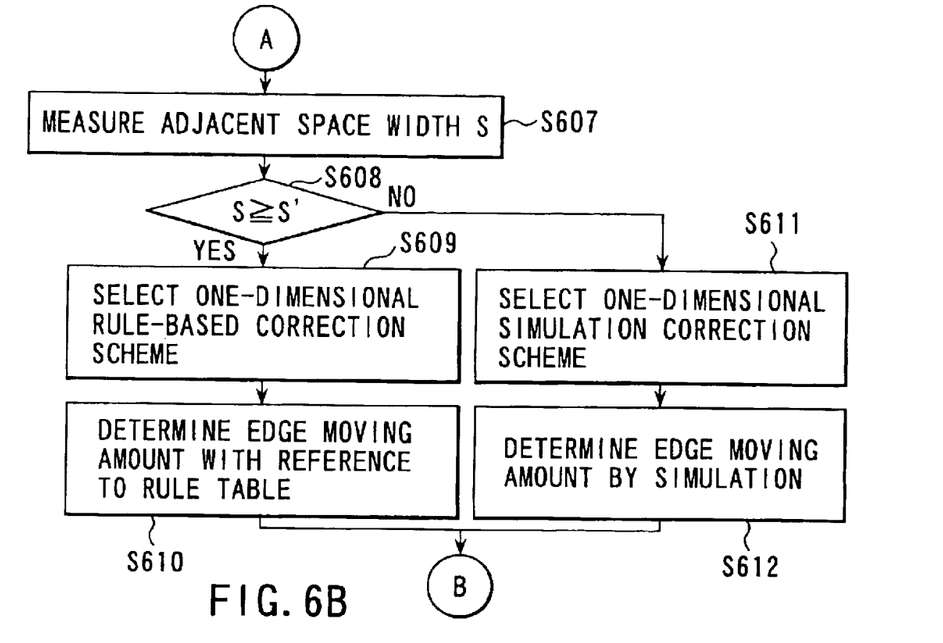
Figure 6C:
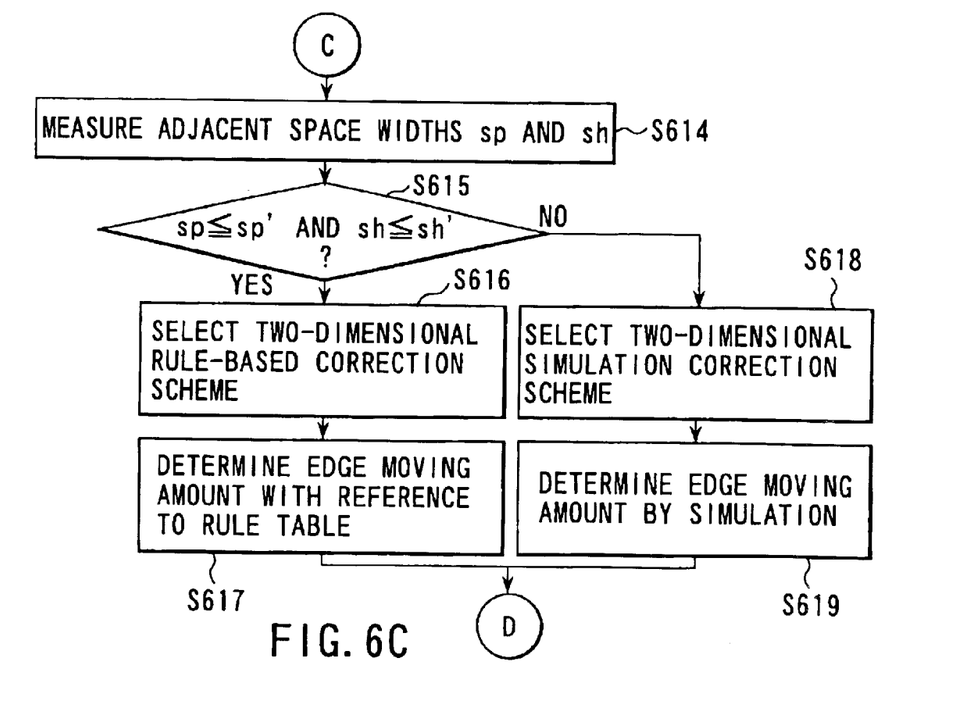
Figure 7:
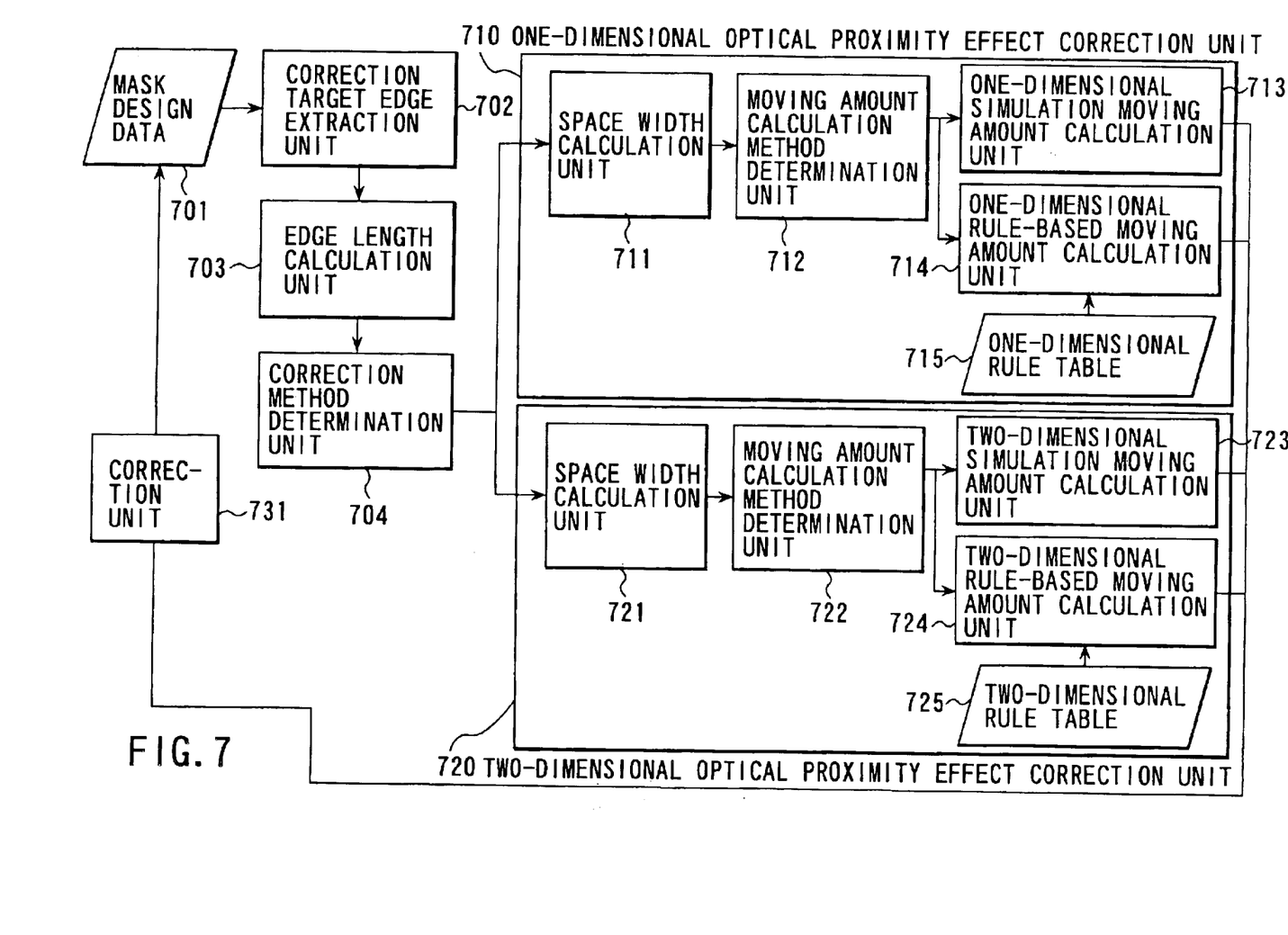
FIG. 7 is a block diagram showing the schematic arrangement of a mask design system according to the fourth embodiment.

FIGS. 6A to 6C are flow charts showing the outline of the pattern edge correction method according to the fourth embodiment. FIG. 7 is a block diagram showing the configuration of a mask pattern creation system for correcting the pattern edge. The processing procedures and system will be explained with reference to FIGS. 6A to 6C and 7.

[Step S601]
Design data 701 of a mask pattern is input.

[Step S602]
A correction target edge extraction unit 702 checks whether a correction target edge exists.

[Step S603]
If the correction target edge extraction unit 702 determines that a correction target edge exists, it extracts a pattern having the correction target edge from the design data 701.

[Step S604]
An edge length calculation unit 703 measures the length of the extracted correction target edge.

[Step S605]
A correction method determination unit 704 checks whether a length L of the correction target edge is equal to or larger than a critical length L' at which the pattern having the correction target edge can be processed as a one-dimensional pattern by ignoring the length of the pattern.

[Step S606]
If the length L of the correction target pattern is determined in step S605 to be equal to or larger than the critical length L', the correction method determination unit 704 determines that the one-dimensional optical proximity effect is corrected by a one-dimensional optical proximity effect correction unit 710. In this correction, the pattern is processed as a one-dimensional one which considers only the direction of width (direction perpendicular to the direction of length) of the pattern by ignoring the direction of length of the pattern.

[Step S607]
An adjacent space width calculation unit 711 extracts from the design data 701 an edge adjacent in a direction perpendicular to the direction of length of the correction target edge, and calculates an adjacent space width S between the correction target edge and the extracted adjacent edge.

[Step S608]
A moving amount calculation method determination unit 712 compares the calculated adjacent space width S with a critical value S', and determines whether the adjacent space width S is equal to or larger than the critical value S'. The critical value S' has described in the second embodiment.

[Step S609]
If the adjacent space width S is determined to be equal to or larger than the critical value S', the moving amount calculation method determination unit 712 determines that the moving amount is calculated by the one-dimensional rule-based scheme.

[Step S610]
A one-dimensional rule-based moving amount calculation unit 714 determines the moving amount of the correction target edge with reference to a one-dimensional rule table 715, and corrects the design data 701 in accordance with the determined moving amount. The flow returns to step S602 to check whether a correction target edge exists.

The one-dimensional rule table is determined using as a parameter at least one of the size of the pattern including the correction target edge, the distance between the correction target edge and a pattern adjacent to the correction target edge, and the size of the pattern adjacent to the correction target edge.

[Step S611]
If the adjacent space width S is determined in step S608 to be smaller than the critical value S', the moving amount calculation method determination unit 712 selects the one-dimensional simulation correction method.

[Step S612]

A one-dimensional simulation moving amount calculation unit 713 ignores the line width of the pattern including the correction target edge, executes a simulation, and calculates the moving amount of the correction target edge.

The flow returns to step S602 to check whether a correction target edge exists. In this case, the simulation scheme which ignores the line width of the pattern suffices to be a known method.

[Step S613]

If the pattern length L is determined in step S605 to be smaller than the critical length L', the correction method determination unit 704 selects that the edge moving amount is determined by a two-dimensional optical proximity effect correction unit 720 on the basis of the two-dimensional optical proximity effect. In this case, the line width of the pattern containing the correction target edge is also considered, the pattern is processed as a two-dimensional one, and the edge moving amount is calculated.

[Step S614]

A space width sp between the correction target edge and the edge of a pattern nearest in a direction perpendicular to the direction of length of the correction target edge is calculated. A space width sh between the correction target edge and the edge of a pattern nearest in the direction of length of the correction target edge is calculated.

[Step S615]

The moving amount calculation method determination unit checks whether the calculated adjacent space width sp is equal to or smaller than a critical value sp', and the adjacent space width sh is equal to or smaller than a critical value sh'.

[Step S616]

If $sp \leq sp'$ and $sh \leq sh'$, are determined in step S615 to be established, the moving amount calculation method determination unit selects that the edge moving amount is determined by the two-dimensional rule-based correction scheme.

[Step S617]

A two-dimensional rule-based calculation unit 724 calculates the moving amount of the correction target edge with reference to a two-dimensional rule table 725.

The flow returns to step S602 to check whether a correction target edge exists.

[Step S618]

If $sp \leq sp'$ and $sh \leq sh'$ are not determined in step S615 to be established, the moving amount calculation method determination unit selects the two-dimensional simulation correction scheme.

[Step S619]

A two-dimensional simulation moving amount calculation unit 723 performs a two-dimensional simulation in consideration of a pattern layout present within a predetermined range from the correction target edge, and calculates the moving amount of the correction target edge.

The simulation scheme used to determine the edge moving amount suffices to be a known method. For example, the edge moving amount is determined by a simulation for a pattern layout present within a given range centered on the edge of the correction target pattern.

[Step S620]

After the moving amount of the correction target edge is calculated by any method described above, a correction unit 731 corrects the design data 701 on the basis of the calculated moving amount. The flow returns to step S602 to check whether a correction target edge exists. All correction target edges are corrected by the above-mentioned method until no correction target edge is determined to exist.

The embodiments of the present invention have been described. The above functions can be realized by using hardware or by using a program to cause a computer to process the functions.

The program capable of causing the computer to execute the functions can be applied to various devices in the form of a recording medium such as a magnetic disk (floppy disk or hard disk), optical disk (CD-ROM or DVD), or semiconductor memory. Alternatively, the program can be transmitted via a communication medium and applied to various devices.

The above-described embodiments are merely examples, and numerical values used above are also merely examples. The embodiments should be applied in accordance with each device or layer, and detailed numerical values should be determined from experimental results or more strict calculation results.

The present invention can be variously modified within the spirit and scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask pattern correction method used to form a desired pattern on a wafer by a projection optical system, comprising:

a step of extracting a correction target edge from a design pattern;

a step of calculating a length of the extracted correction target edge;

a first step of calculating correction value determined one-dimensionally by pattern layout perpendicular to the correction target edge when the length of the correction target edge calculated in the previous step is not smaller than a predetermined critical length; and a second step of calculating correction value determined two-dimensionally by pattern layout around the correction target edge when the length of the correction target edge calculated in the previous step is smaller than a predetermined critical length, the first step including:

a distance calculation step of calculating a distance S from target edge to a nearest edge of an adjacent pattern perpendicularly;

a step of calculating the correction value by one-dimensional simulation according to pattern layout perpendicular to the correction target edge, moving the correction target edge on a basis of the calculated correction value when the calculated distance S is smaller than a predetermined critical value S'; and a step of moving the correction target edge on the basis of a correction value set as a rule in advance using as a parameter at least one of the distance S, a line width W of the pattern including the correction target edge, and a line width W' of a pattern including an edge adjacent to the correction target edge when the calculated distance S is not smaller than the critical value S', and the second step including:

a distance calculation step of calculating a distance sp from the correction target edge to a nearest edge in a perpendicular direction, and calculating a distance sh to a nearest edge in a direction of length;

a step of calculating the correction value by two-dimensional simulation according to pattern layout around the correction target edge, and moving the correction target edge on the basis of the calculated correction value when at least either one of the distances sp and sh calculated in the distance calculation step is smaller than a corresponding one of predetermined distances sp' and sh'; and a step of moving the correction target edge on a basis of an edge moving amount set as a rule in advance using as a parameter at least one of the distances sp and sh, the line width W of the pattern containing the correction target edge, and line widths wp and wh of patterns adjacent to the correction target edge when the calculated distance sp is not smaller than the critical distance sp', and the calculated distance sh is not smaller than the critical distance sh'.

* * * * *